United States Patent [19]
Johnson et al.

[11] Patent Number: 5,235,521
[45] Date of Patent: Aug. 10, 1993

[54] REDUCING CLOCK SKEW IN LARGE-SCALE INTEGRATED CIRCUITS

[75] Inventors: Charles L. Johnson; Robert F. Lembach; Bruce G. Rudolph; Robert R. Williams, all of Rochester, Minn.

[73] Assignee: International Business Machines Corporation, Armonk, N.Y.

[21] Appl. No.: 773,061

[22] Filed: Oct. 8, 1991

Related U.S. Application Data

[62] Division of Ser. No. 502,474, Mar. 30, 1990, Pat. No. 5,077,676.

[51] Int. Cl.⁵ .............................................. G06F 15/60
[52] U.S. Cl. ...................................... 364/489; 364/488
[58] Field of Search ................ 364/485, 489, 490, 491

[56] References Cited

U.S. PATENT DOCUMENTS

| | | | |
|---|---|---|---|
| 4,263,651 | 4/1981 | Donath et al. | 364/490 |
| 4,694,403 | 9/1987 | Nomura | 364/488 |
| 4,698,760 | 10/1987 | Lembach et al. | 364/490 |
| 4,823,278 | 4/1989 | Kikuchi et al. | 364/491 |
| 4,924,430 | 5/1990 | Zasio et al. | 364/578 |
| 5,003,487 | 3/1991 | Drumm et al. | 364/489 |
| 5,010,493 | 4/1991 | Matsumoto et al. | 364/490 |
| 5,077,676 | 12/1991 | Johnson et al. | 364/489 |

OTHER PUBLICATIONS

IEEE, 1983 "Timing Analysis for nMOS VLSI", Norman P. Jouppi.
IEEE, 1983 "Signal Delay in RC Tree Networks", Jorge Rubinstein.
IEEE, 1982 "Synchronous Path Analysis in MOS Circuit Simulator", V Agrawal. 1984 Conf on Advanced Research in VLSI M.I.T. Signal Delay in General RC Networks with Application to Timing Simulation of Digital Integrated Circuits.

Primary Examiner—Vincent N. Trans
Attorney, Agent, or Firm—Roy W. Truelson; J. Michael Anglin

[57] ABSTRACT

In a system of digital chips, the time delay in all clock trees is equalized by equalizing the delay through each level of all trees. The level delays are equalized by adjusting the capacitance of terminators in each net at each level, and/or by adjusting the performance (power) of each driver at each level. Where the capacitance of a net is too low to be compensated by a driver, a capacitive terminator is selectively added to that net.

12 Claims, 6 Drawing Sheets

```
500 ┐
 501 ─┤DEFINE TREE LEVELS AND DESIRED LEVEL DELAYS
 502 ─┤FOR EACH CHIP - -
 510 ─┤   FOR EACH TREE - -
 511 ─┤      FOR EACH UPPER LEVEL - -
 512 ─┤         CREATE CLOCK LOGIC AT FIXED PERF
 513 ─┤      FOR EACH INTERMEDIATE DEEP LEVEL - -
 514 ─┤         CREATE CLOCK LOGIC AT VARIABLE PERF
 520 ─┤   SYNTHESIZE FUNCTIONAL LOGIC
 521 ─┤      FOR EACH TREE / FINAL LEVEL / EACH NET - -
 522 ─┤         INSERT CONDITIONAL TERMINATOR
 530 ─┤   COMBINE FUNCTIONAL AND TREE LOGIC
 531 ─┤      FOR EACH TREE / EACH UPPER LEVEL / EACH NET - -
 532 ─┤         INSERT TERMINATOR
 533 ─┤      FOR EACH TREE / NEXT-FINAL LEVEL / EACH NET - -
 534 ─┤         INSERT CONDITIONAL TERMINATOR
 540 ─┤   PLACE ALL LOGIC INTO CHIP CELLS
 541 ─┤   MODIFY CLOCK NETS
 542 ─┤   WIRE CHIP CELLS TOGETHER
 550 ─┤   FOR EACH TREE / EACH DEEP LEVEL / EACH NET - -
 551 ─┤      FIND ACTUAL LOAD
 552 ─┤      IF TERMINATOR PRESENT - -
 553 ─┤         SET CAP TO GET MIN LOAD
 554 ─┤      SET DRIVER PERFORMANCE TO GET DESIRED DELAY
 555 ─┤      IF<MIN OR >MAX - - SET NET WARNING
 560 ─┤   FOR EACH TREE / EACH UPPER LEVEL / EACH NET - -
 561 ─┤      SET TERMINATOR CAP TO GET DESIRED DELAY
 562 ─┤      IF<MIN OR >MAX - - SET NET WARNING
 570 ─┤   DO UNTIL DESIGN MEETS CRITERIA - -
 571 ─┤      PERFORM MANUAL REWIRING
 572 ─┤      UPDATE MASTER DESIGN
           * * * * * * * * * * * * *

534
 522 ┐
 503 ─┤ESTIMATE TOTAL NET LOAD
 504 ─┤IF LOAD<MIN RANGE - -
 505 ─┤   INSERT TERMINATOR
```

FIG. 5

REDUCING CLOCK SKEW IN LARGE-SCALE INTEGRATED CIRCUITS

RELATED APPLICATIONS

This is a divisional application of U.S. patent application Ser. No. 07/502,474, filed Mar. 30, 1990, now U.S. Pat. No. 5,077,676.

BACKGROUND OF THE INVENTION

The present invention relates to designing very-large-scale integrated (VLSI) circuits, and particularly concerns methods for reducing the time skew between the arrival times of clock signals at different logic circuits within a system of digital chips in a system, and systems of chips having a reduced clock skew.

Digital systems, such as data processors, are commonly implemented as a system of multiple VLSI chips, typically three or four to a dozen or more on a printed-circuit board. Depending upon the semiconductor technology, each chip may have up to 75,000 or more logic circuits, all operating at nanosecond or picosecond gate delays. The overall operation of such a system depends upon a number of clock signals for synchronizing the logic functions over all the chips. The maximum speed of the system depends linearly upon a cycle time established by one or more of these clocks.

It is absolutely essential that such clock signals arrive in a predetermined sequence at various functional logic circuits within the system, both on the same chip and on different chips. The cycle time must be deliberately limited to ensure that skew in the arrival times does not cause errors in the logic. Skew can occur when clock signals pass through different numbers of gates on their way to different destinations. Skew can occur when the loading on different branches of a clock tree are different. Skew can occur when the wiring in different branches introduces different delays.

Clock skew causes two types of problems "Early mode" faults occur when two supposedly sequential clock signals overlap each other, resulting in the transmission of a data signal one clock cycle earlier than intended "Late mode" problems occur when there is a reduction of the usable portion of the system cycle time due to clock separation. Both types of problems can occur among the circuits of a single chip and between the circuits of two different chips in a system.

A typical processor board having half a dozen chips using conventional CMOS technology may operate at a cycle time of 50 nsec. The entire system could operate about 10% to 20% faster without changing anything except for the skew in the arrival times of the clocks at different circuits and chips in the system. Moreover, any decrease in clock skew translates into a linear decrease in the achievable cycle time: one nanosecond of skew eliminated is one nanosecond shorter cycle time.

SUMMARY OF THE INVENTION

The present invention decreases the cycle time in systems of VLSI digital chips by reducing the skew between the arrival times of clock signals at different logic circuits, both on the same chip and on other chips of the system. This goal is attained with low design time, and without expensive, lengthy, and highly intuitive procedures involving entirely manual designs.

Broadly, the invention equalizes the time delay of each net of each clock tree of each chip of a system. Each tree is divided into a number of levels, and the delay is equalized at each level. Level delay is equalized by adjusting the capacitance of a terminator circuit added to each net, so that the net capacitive loadings are the same. Level delay is also equalized by adjusting the performance or power level of a driver circuit for each net, to compensate for different capacitive loads in the nets; where the load falls below a compensatable minimum, a terminator can be added to only those nets which require them.

DESCRIPTION OF THE DRAWINGS

FIG. 5 is a diagram of a method for designing a clock tree according to the invention.

DESCRIPTION OF A PREFERRED EMBODIMENT

Figure 1:
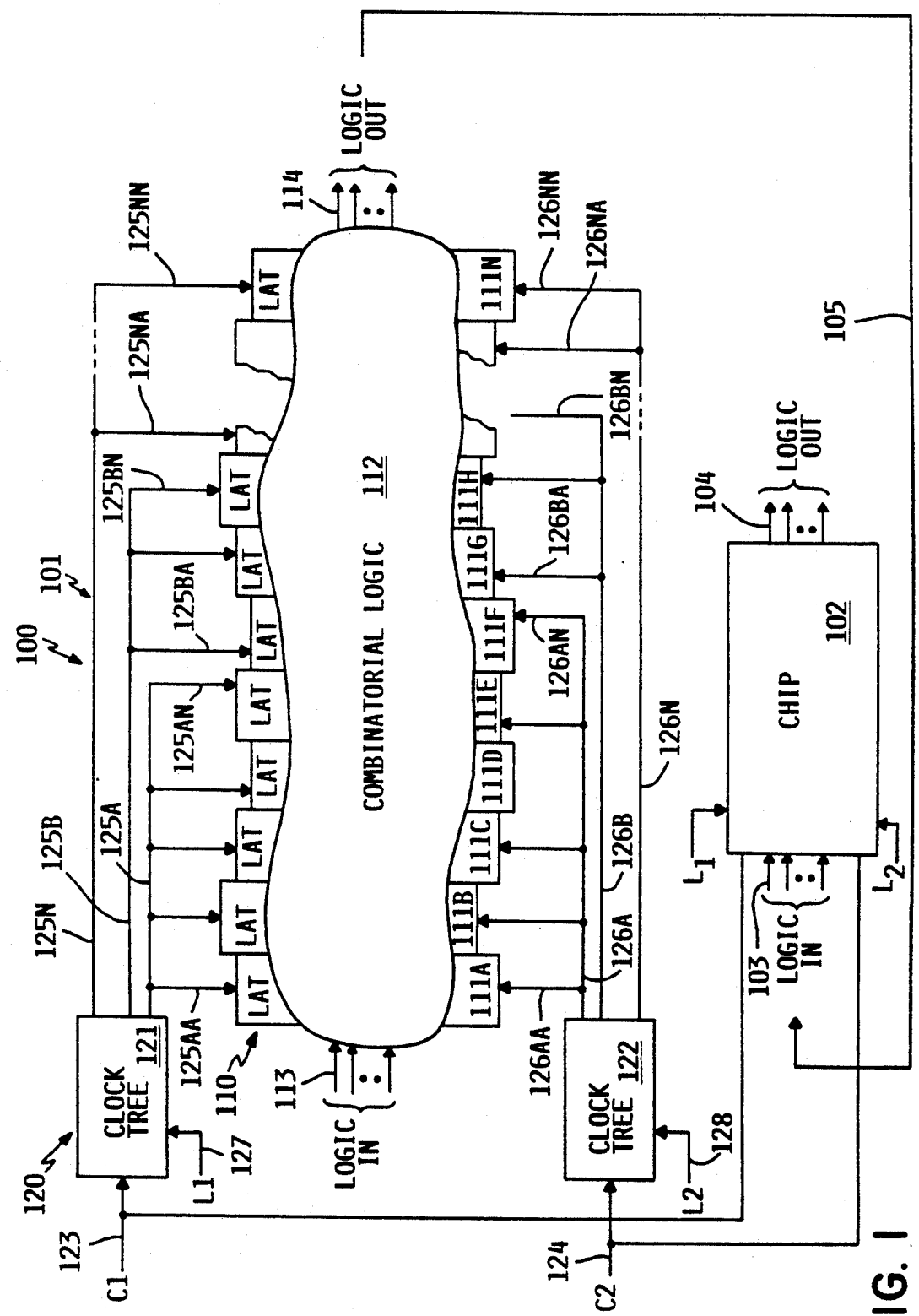
FIG. 1 is a block diagram of a system of integrated-circuit chips in which the present method finds utility.

FIG. 1 shows a system 100 of very-large-scale-integration (VLSI) digital integrated-circuit chips 101 and 102, such as might be used in a digital computer. In this example, the chips are fabricated in a conventional complementary metal-oxide-semiconductor (CMOS) technology.

Chip 101 contains a set of logic circuits 110, having clocked latches IIIA through 111N coupled to combinatorial logic gates 112. Lines 113 carry digital input signals onto chip 101, while lines 114 carry output signals to off-chip destinations. Signals 113 and 114 may be connected to any of the logic gates 112, and the gates may be wired together and to latches 111 in an arbitrary manner, to implement any desired functions. A typical chip may have 25,000 to 75,000 individual logic circuits 110, of which 300 to 2500 might typically be latches 111.

A set 120 of clock trees 121 and 122 receive conventional clock signals C1 and C2 on lines 123 and 124. Clock tree 121 repowers Cc, and distributes copies of it on branch lines 125 to some of the latches 111. If the maximum permissible fanout of the technology is about five unit loads, and chip 101 contains 2500 latches, clock tree 121 must provide up to 500 output lines 125; these are individually labeled 125A-125N in FIG. 1. Although all lines preferably have equal loading, some might not; line 125B, for example, has only three loads, latches 111F, 111G, and 111H. Clock tree 122 repowers C2, distributing it to gates 111 on branch lines 126. Again, up to 500 or so branches 126A-126N may be needed.

Not all clocks need be distributed to all latches 111. Gate 111D, for example, has no clock input from tree 122. Different lines of the two clock trees may be wired to the same latch; latch 111F receives C1 from line 125B (via branch 125BA), but receives C2 from line 126A (via branch 126AN). Some clock signals may require enabling or disabling from logic inputs. Diagnostic functions or single-step capability, for example, may require that a logic signal L1 on line 127 disable all output lines 125; other functions may require that, say, line 125A be prevented from sending C1 to gates 111A-111E, while the other lines 125 continue to transmit C1 to their respective logic gates. One or more logic signals on lines 128 provide the same capability for clock tree 122.

Chip 102 contains logic gates and clock trees similar to those of chip 101. Chips 101 and 102 receives C1 and C2 in parallel. Clock control logic inputs L1 and L2 into chip 102 may be the same as or different from those input into chip 101. The logic inputs 103 and outputs 104 of chip 102 are usually at least partially interconnected with lines 113 and 114 of chip 101 by interchip wiring such as 105.

The proper operation of multi-chip system 100 requires that all logic gates 111 of chip 101 receive clock signal C1 simultaneously, that all gates receive C2 simultaneously, and that the precise time intervals between C1 and C2 at their inputs 123 and 124 be preserved faithfully at all the gates. The same holds true for chip 102, and in addition the input-to-gate timings of both C1 and C2 within chip 102 must exactly track those of chip 101. To the extent that not all of these conditions are fulfilled, clock cycle time must be wasted to insure that no early-mode or late-mode timing failures will occur.

Figure 2A:
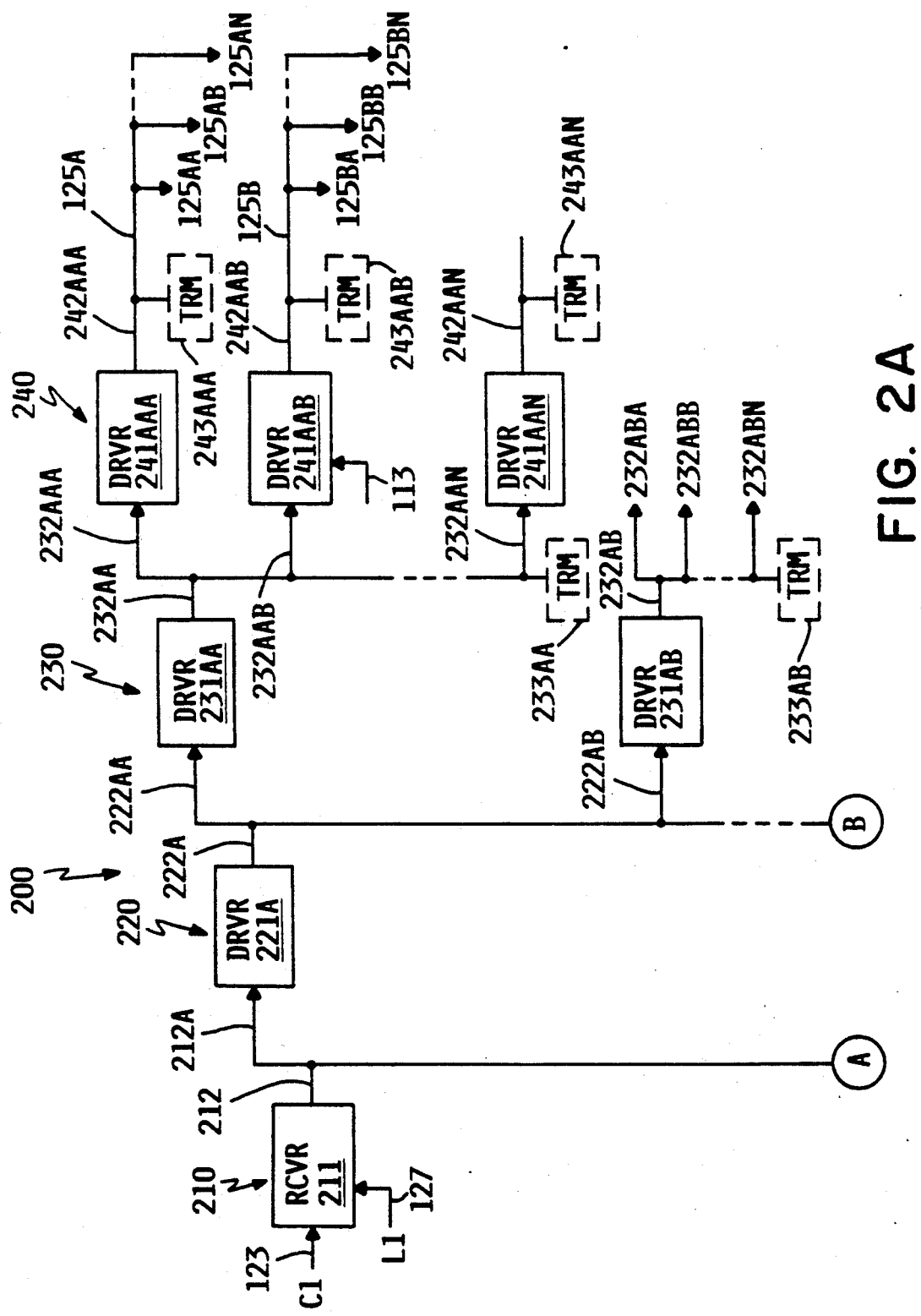
FIGS. 2A and 2B are block diagrams of a clock tree of FIG. 1.
Figure 2B:
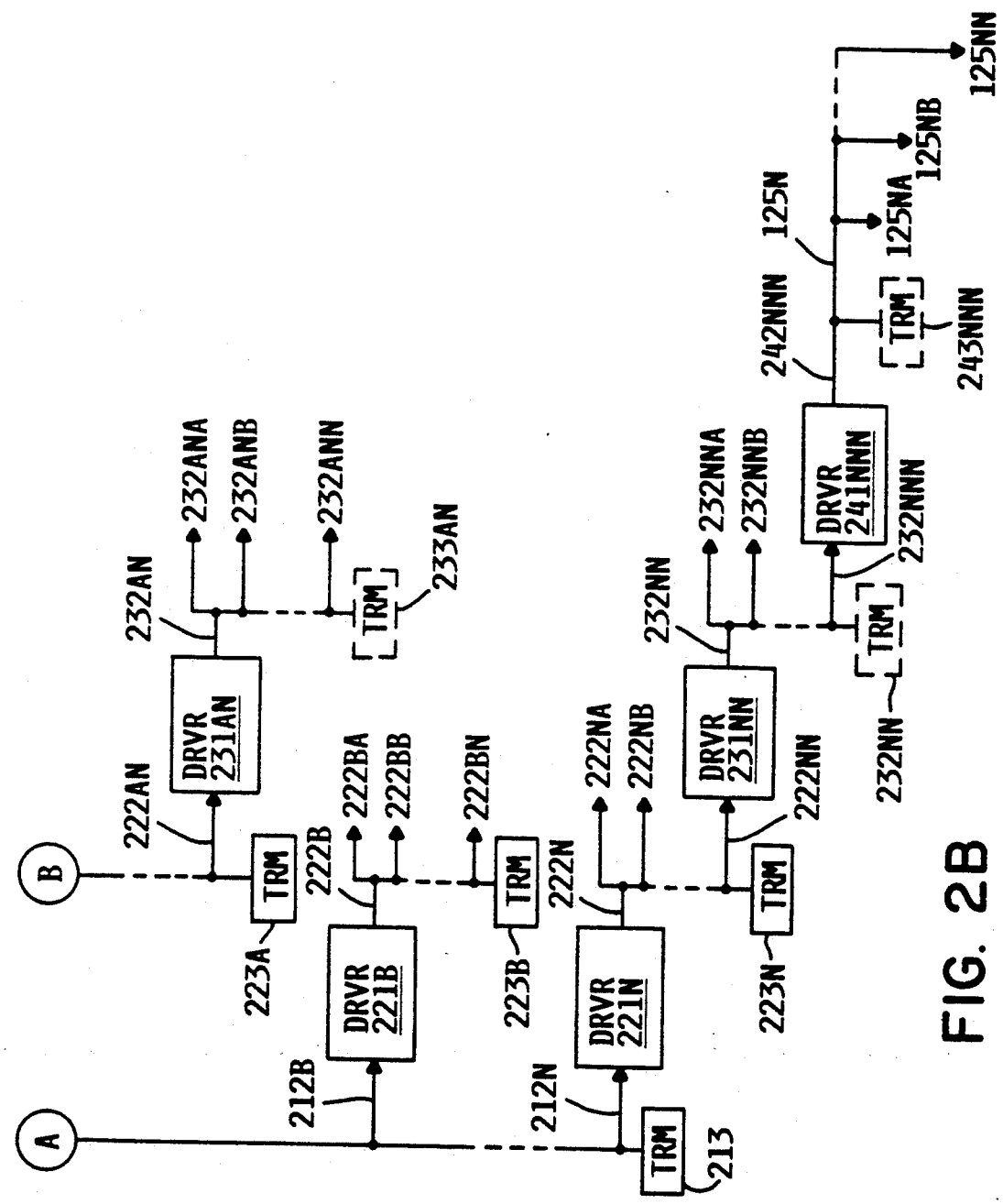

FIG. 2 shows a clock tree such as 121, FIG. 1. At the first level 210 of the tree, a conventional receiver circuit 211 converts clock signal C1 on line 123 into an intermediate signal on net 212. This signal is capable of driving up to a certain maximum load (fanout) on net 212 of chip 101. This load depends upon the particular chip technology, usually four to six circuit inputs for CMOS chips; this example uses five as the maximum fanout. A logic signal L1 on line 127 may also switch receiver 210 on or off, as described above.

Intermediate signal 212 appears at the inputs of a second-level set 220 of conventional driver circuits 221A–N with a certain time delay from the original signal on input line 123. The amount of this delay varies primarily with the total capacitance which is connected to the output of receiver 211; this is made up of the capacitance of all first-level branches 212A–212N of line 212, the input capacitances of the individual driver circuits 221A–221N on this net, and the capacitance of any terminator circuits 213. As described in connection with FIG. 5, the tree is designed to achieve the desired first-level delay by adjusting the capacitance of terminator 213 so as to bring the total level delay through each block in that level to the same value. (Some terminology: The term "net" refers to a network of a line and its branches, such as the net formed by line 212 and its branches 212A–N. A "stage" is a driver and the network coupled to its output; driver 211, line 212, and branches 212A–N form a stage, the only stage at the first level 210.) In this implementation, circuits 221A–N are identical, and all have the same fixed power level.

At the second level 220 of the tree, drivers 221A–N receive the respective branches 212A–N form the first level 210. Each second-level driver 221A–N is identical; with a maximum fanout of five, there may be as many as five of them. They are all of identical design; they all have the same output power level, and the same circuit delay from input to output. Driver 221A repowers the first-level intermediate signal 212 to a second-level intermediate signal 222, capable of feeding as many as five additional unit-load drivers on second-level branches 222A–N. A desired second-level loading is achieved by adjusting the capacitance of terminator 223A so as to bring the total net delay to a particular value. The other second-level branches are similar, although each may have a different number of branches 222NA–NN on its output line 222N, and thus a different adjustment in its terminator 223N. This is required because the input-to-output time delay to all branches 222AN–NN must be the same. (And this delay must be the same for all clock trees on chip 101, and must also be the same as all clock trees on other chips such as 102 as well.)

At a third level 230 of the tree, drivers 231AA–231AN receive the respective branches 222A to produce third-level intermediate signals on lines 232A–N having a desired time delay from the previous intermediate signals on line 222A. Again, the amount of this delay varies primarily with a total branch capacitance made up of the capacitance of the branches of line 222A, the input capacitances of the individual driver circuits 231AA–231AN, and the capacitance of any terminator circuit 223A which may be required. The goal at this level is to bring the total delay through every level-three branch to the same value as the delays through every other level-three branch in tree 121—and in every other tree on chip 101, and in all the trees in chip 102, FIG. 1.

Because of the potentially very large number of branches at this and succeeding levels, the delays are adjusted differently in the third and subsequent levels of the tree. At this level, the number of 16 branches has already multiplied to the range of 64 to 216 (for maximum fanouts of 4 to 6 unit loads, respectively), and the next level would bring the total number of branches up to the range of 320 to 1512. Using terminators such as 213 and 223A–N for every level could take up a significant amount of chip space. In contrast, the total number of terminators at the first and second levels is only 5 to 37 (for fanouts of 4 to 6), which amounts to a tiny fraction of the circuit cells available on chip 101.

Therefore, drivers 231AA–231NN are not all identical. Although they have the same circuit topology, their output devices can be fabricated in a number of different discrete sizes. In CMOS devices, wider channels have higher performance levels, so they can drive larger loads (i.e., more capacitance) at the same delay time. As explained in connection with FIG. 5, the range of driver sizes of this embodiment cannot compensate over the entire range from no output load to the maximum fanout plus wiring load. Accordingly, if the actual fanout from a third-level driver is less than some percentage of its full capability, a terminator such as 233AA is hung on the line to bring the load up to at least the minimum which can be compensated by one of the multiple power levels of the drivers. Normally, clock trees are—or can be specifically designed to be—highly symmetrical. Accordingly, in practice, very few terminators will be required in most trees. That is, although the invention may require some extra chip cells for terminators at the deeper levels, the number is very small, and is only at most one or two percent of the number which would be required by using fixed-power drivers at the deeper levels. The third-level terminators 243 are shown as dashed boxes, since only a very few of them actually exist. The delay for other third-level branches is adjusted in the same manner, as illustrated by multiple-power driver 231NN and terminator 233NN, for example.

In this embodiment, four tree levels are required by fanout limitations on the circuit technology; other circuits and other technologies may require more or fewer levels. Such situations can be easily implemented by using more or fewer intermediate levels such as level 230.

At the fourth and final level 240 of the tree, drivers 241AAA-241AAN receive the respective branches 232AAA-AAN of line 232AA to produce fourth-level intermediate signals on line 242AAA-AAN having a certain time delay from the third-level intermediate signals on line 232AAA-AAN. Variation in the amount of this delay in each fourth-level branch depends primarily upon a total branch capacitance made up of the capacitance of the final branches (twigs) of line 242AAA, the input capacitances of the individual loads on these branches, and the capacitance of any terminator circuit 243AAA which may be required on individual ones of those branches.

These final branches are the lines 125 shown in FIG. 1. That is, line 242AAA becomes line 125A in FIG. 1, and its final branches are lines 125AA-125AN. Similarly, line 242AAB becomes line 125B, with branches 125BA-BN, all the way to line 242NNN's coupling to branches 125NA-NN via line 125N. Driver 241AAA can be fabricated in any one of a number of different power-level steps, to bring the delay due to the total capacitance of the final branches and the driver's propagation delay within a predetermined range of delay times. These drivers can be gated if required; driver 241AAB, for example, receives a gating signal 113 from combinatorial logic 112, FIG. 1, for enabling or inhibiting the output clock signal 242AAB independently of any other clock signals.

As in the preceding level, terminators 243AAA-AAN may be added where required to bring the loading up to a minimum which can be adjusted for by the different power or performance levels of the driver circuits. The other final-level branches, down to driver 241NNN and terminator 243NNN, are designed similarly—as are the final levels of the other clock trees on the same and other chips—to achieve the same overall time delay as closely as possible.

In this way, the total delay through clock tree 121 is the same from the C1 input on line 123 to the clock inputs 125AA-NN to the logic modules 111A-N, FIG. 1. And, this delay is the same as the delay from C2 on line 124 to the clock inputs 126AA-NN. And this delay in turn is the same as similar clock trees on all other chips such as 102 in the same system that receives these clocks. (Other, conventional techniques exist to compensate for chip-to-chip wiring delays in the input lines 123 and 124.)

Figure 3:
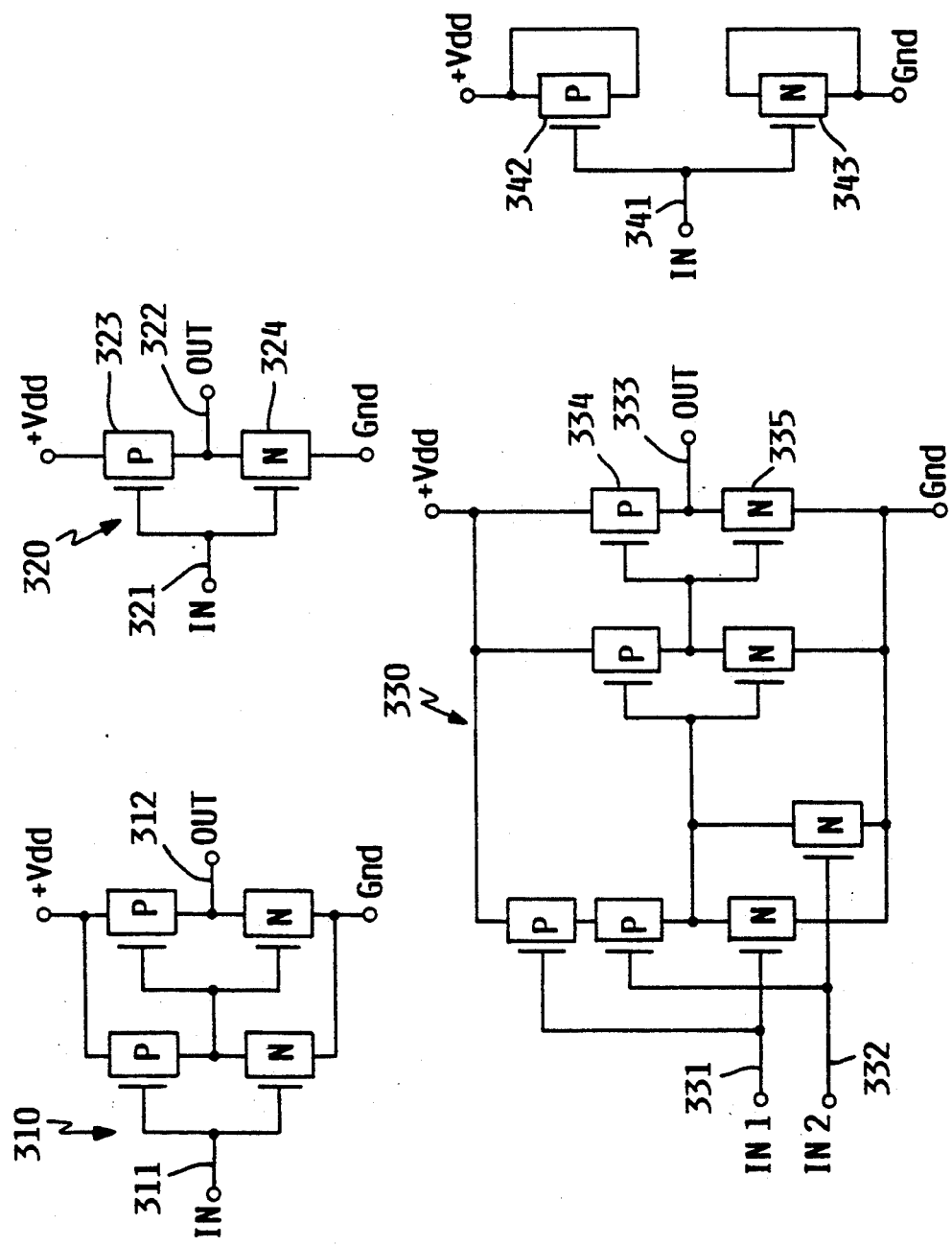
FIG. 3 contains circuit diagrams of typical circuits for the clock tree of FIG. 2.

FIG. 3 shows several circuits of conventional topology which may be used in the clock trees 121, 122, etc. A 'P' in a FET symbol indicates a P-channel device, while an 'N' indicates an N-channel device.

Driver circuit 310 is a non-inverting driver for repowering input 311 so as to drive five load units at its output 312. This driver may be used at a fixed power level for second-level drivers 221A-N, for example.

Circuit 320 is an inverting driver for repowering input 321 so as to couple to as many as five loads at its output 322; the polarity of the output is inverted from that of the input. The power or performance level of this (or any other) driver can be changed merely by changing the dimensions of the output FETs 323 and 324, in accordance with known practice. Greater channel widths pass greater power, and drive a given load with a smaller time delay—or, equivalently, drive a higher load with the same delay. Drivers 320 of any power level within the range required for the present purpose can be physically located within the same size circuit cell on a chip, so that larger FETs—at least, within the range contemplated by the present invention—do not require additional chip area to implement.

Driver circuit 330 can be used as a gated driver such as 241AAB in FIG. 2. In this case, output 333 is the logical NOR of the two inputs 331 and 332. Here again, different power levels can be achieved within the same cell size by varying the dimensions of output FETs 334 and 335.

Circuit 340 is an inverter rewired as a capacitor, for use as any of the terminators such as 213, 223A-N, 233AA-NN, or 243AAA-NNN in FIG. 2. The channel of PFET 342 is shorted and wired to the positive supply, Vdd, while the shorted channel of NFET 343 is coupled to ground; this provides capacitance for signal swings in both directions. The capacitance value of the circuit at terminal 341 is the gate-to-channel capacitance of each device, if the two devices have the same physical dimensions. In a typical CMOS embodiment, the device dimensions can be set in twenty discrete steps to achieve capacitance values in the range of 0.05pF to 1.0pF. If this does not provide a sufficient range, additional terminator circuits 340 can be added in parallel; any reference to a terminator should thus be taken to apply to multiple terminator circuits as well.

Other semiconductor technologies have analogous methods for providing multiple-performance drivers and capacitive terminators. In bipolar or BI CMOS technologies, for example, variable performance or power may be achieved by varying the size of a resistor or the size of the bipolar transistors. "Power" and "performance" levels or versions are equivalent terms, and refer to the ability of a circuit to drive a load at different speeds, or with different time delays.

Figure 4:
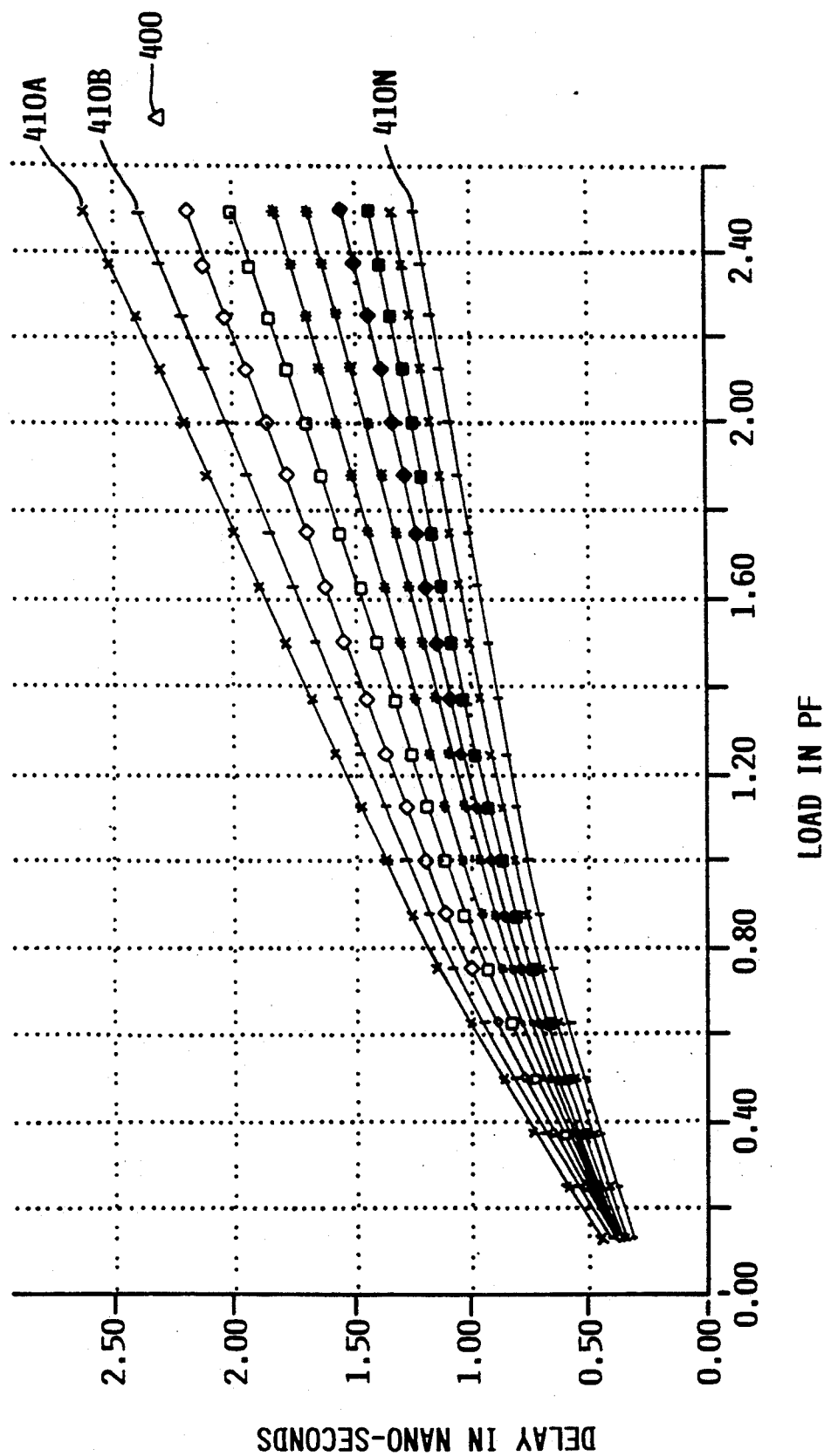
FIG. 4 is a graph of time delay versus loading for one of the circuits of FIG. 2.

FIG. 4 shows a graph 400 of typical circuit delays versus capacitive loading for a number of different discrete power levels in a driver circuit such as 310, FIG. 3; circuits 320 and 330 have a similar relationship, but with slightly different values. For the lowest-power version of the circuit, curve 410A depicts a speed variation from about 0.50 nsec at an output load of 0.20 pF to about 2.6 nsec at the highest design load of 2.40 pF. The next larger (more powerful, higher performance) version of the circuit has somewhat less delay at all loadings, as shown in curve 410B. The highest-power version, curve 410N, has the smallest delays, and also has less variation with loading than the other versions. In the design method to be described, the desired branch delay is located on the ordinate of the graph, the capacitive output load on a given driver is located within the range of permissible loads on the abscissa of graph 410, and that curve 410 nearest their intersection is chosen to select the particular circuit version which provides the desired delay effect.

FIG. 5 shows the steps of a design method 500 for practicing the invention. The method may be practiced manually by a skilled circuit designer, entirely in a digital computer, or, preferably, by a combination of computer programs and a circuit designer.

First, step 501 defines certain parameters of the entire system 100. These parameters depend upon the semiconductor technology to be used, the chip size, and so forth. Chief among these parameters are the fanout of the circuit elements to be used for the clock trees, the number of the levels in the trees, the minimum acceptable loading on any wiring net, the number and characteristics of the terminators and multiple-performance driver circuits, and the desired time delay for each level of the clock trees. The level delay of any level is made up of a block delay through the circuit at that level (i.e., the propagation time through the driver circuit) and a wire delay due to the RC time constant of the net wiring; the term "stage delay" is sometimes used instead of level delay, since the level delay is equal to the delay through each stage (one driver plus its output net) of that level. The level delay at any level is the same for every tree in every chip of the system; however, the delay of one level need not be the same as the delay of another level, and in fact is usually different. The level delays should be made small, so that unavoidable environmental effects and process variations introduce as little clock skew as possible. Although minimizing the number of tree levels may reduce total clock delay, limiting driver fanout in the trees decreases uncompensated transmission-line delays. The important point is that the clock trees must be architected as a unit for the system; the trees cannot be designed individually without regard for other trees in the same system.

Step 502 iterates the subsequent steps for every chip 101, 102, etc. in the system 100.

Steps 510-516 design certain levels of the trees such as 121 and 122 on the current chip, namely, those closest to receiver 211. In the present embodiment, steps 510-514 operate upon the levels which are not gated by the functional logic 112: i.e., levels 210, 220, and 230. Step 510 iterates the subsequent steps once for each tree.

Step 511 iterates through the upper levels of a selected tree; in the present embodiment, the "upper" levels are those using fixed-performance drivers and a terminator on every net. Step 512 then synthesizes the actual logic. In level 210, for example, step 512 specifies a particular receiver circuit or "book" capable of repowering signal 123 to a number of next-level drivers via net 212. It then determines how many drivers 221 are required, and selects circuits such as 310 for their implementation. The device sizes of these circuits are all the same, so that they all have the same fixed power level. This power level should be relatively high, to minimize the level delay time. The small number of drivers at this level does not dissipate a large amount of total power on the chip.

Step 513 selects the intermediate deep levels of a tree for step 514. The "deep" levels of a tree are those which employ variable-performance driver circuits, such as levels 230 and 240 in the present embodiment. Only level 230 is an "intermediate" deep level, level 240 being the "final" deep level. Therefore, step 514 is performed only upon level 230 of the current tree. Step 514 determines how many drivers 231 are required, and wires them to the proper nets from the second level 220. Step 514 selects driver circuits such as 320, FIG. 3, but does not specify a particular performance (power) version at this time. Again, all performance levels of this circuit occupy the same chip space, so that placement and wiring may proceed without knowing which version will ultimately be chosen for any driver.

In the preferred embodiment, steps 512 and 514 are achieved manually by a circuit designer using conventional computer-based tools for specifying logic components and drawing connection diagrams. In a typical chip, the first three levels comprise only about 150 circuits, so that the labor involved is not burdensome. The terminators are not included in this step; they are added at a later point in the design.

Step 520 synthesizes the functional logic of the current chip, the gates 112 and latches 111. Logic synthesis here is preferably performed by conventional computer programs.

Step 520 also includes the synthesis of the final deep level 240 of the clock trees. Step 521 selects in turn each net at the final level 240 of each tree. Step 522 conditionally inserts a terminator in the current net; this step is shown in greater detail at the bottom of FIG. 5. Step 503 estimates the total load on the current net. The synthesis program used in step 520 can do this by looking up the input capacitance of the circuits connected to the net, summing them, and adding an allowance for capacitance due to the wiring in the net. Step 504 determines whether the net load has a capacitance less than the minimum of the range which can be handled by the circuit driving the net. That is, a net capacitance less than a certain amount will always produce a smaller delay at that level than the delay called for by step 501 above, even with the lowest-performance (i.e., slowest) available driver circuit. If the net load is too low, step 505 inserts a terminator into that net, so as to increase the net capacitance to the point where at least one driver version can meet the desired delay.

The estimates of step 503 have a wide error margin, commonly about 50%. However, only one or two percent of all nets will require terminators. The threshold of step 504 is made low enough that a terminator is always included when ultimately required. Although later steps may determine that in fact no terminator was required in a given net, the total number of cells wasted is insignificant. The specific value of each terminator's capacitance is left open at this time; again, all versions of the terminator circuit require the same chip space. During this phase of the design, the actual clock-signal inputs to the final level can be considered to be all the same net, emanating from a single black-box logic element having a huge fanout.

Step 530 combines the logic produced in steps 510-514 and 520-522, by establishing connections from the level 230 drivers to the level 240 drivers via nets 232AA-NN. This step may also prune the clock trees, eliminating branches which turn out not to be required to drive the final levels at their maximum fanout. Steps 531 and 532 insert a terminator into every net 212 and 222A-N in the upper two levels of every tree. Steps 533 and 534 conditionally insert terminators in the nets between the last (or only, in this embodiment) intermediate and the final deep level of each tree; these are the nets 232AA-NN in FIG. 2. These terminators could not have been inserted previously, because the net loading cannot be estimated until step 530 combines the logics. Again, the details of step 534 are shown as steps 503-505 at the bottom of FIG. 5. Designing the clock logic in two parts and then combining them eases the integration of the clockgating signals (such as that shown at driver 241AAB) with the functional logic. In other embodiments, it might be easier to design all levels of a tree together, or to split up the design in other ways.

Steps 540-542 perform the physical design of the chip. A conventional "place and wire" program may be employed for this operation. Such programs are complex and sophisticated, but well known; see, for example, A. W. Aldridge, et al., "A 40K Equivalent Gate CMOS Standard Cell Chip," Proceedings 1987 IEEE Custom Integrated Circuits Conference, pp. 248-251. Such programs conventionally employ metrics for balancing trade-offs among wire lengths and other factors.

To the extent that such facilities are available, they should be set to give the upper tree levels priority as to wire-length constraints.

Step 540 assigns each logic circuit produced by the synthesis steps to a particular physical cell location on the chip. At this point, all of the circuits are included in the design, including all terminators which require cell space on the chip. The design has not yet, however, determined the exact sizes of the terminators nor the performance levels of the multiple-power-level drivers 231AA-NN and 241AAA-NNN at the third and fourth levels of the clock trees. These can be left open, because different drivers and terminators all fit within the same size chip cell; no rewiring or placement will be required when the exact levels are set at a later time.

Step 541 optimizes the logic for the wiring step which follows it; its function is not necessary to the method. If, after circuit placement, the distances from some clock-driver outputs to the inputs of the subsequent drivers greatly exceed other such distances, logically equivalent inputs may be substituted. For example, if driver 231NN in FIG. 2 should end up being located much nearer on the chip to driver 221A than it is to driver 221N, then the input to driver 231NN could be connected to branch 222AB, instead of to branch 222NN. Branches can be changed only at the same tree level, in order to preserve the timing characteristics of the entire tree. Step 531 may be performed automatically by a computer program or manually by a skilled chip designer.

Step 542 causes the place-and-wire program to route the interconnections among all the circuit elements on the chip in accordance with the synthesized logic design. Again, this is a complex but entirely conventional operation.

Next, steps 550–562 establish the actual terminator values and driver power levels for the chip. This portion of the design preferably proceeds from the deepest (i.e., final) tree level backward to the uppermost (initial) level, because the design at one level can affect the capacitance of the level above it to some extent.

Steps 550–555, therefore, design the deep tree levels first. Step 550 itself controls the iteration through the deep levels, 230 and 240 in FIG. 2, beginning with the final level, 240. Step 551 uses conventional data on circuit topology, device sizes, wiring lengths, etc., generated by the synthesis steps to produce another estimate of the capacitive loads on all clock-tree nets at the current tree level. The capacitance of a net depends upon the input capacitance (load) of all the circuits connected to it, and upon the total lengths of the wiring which couple these circuits together. This estimate is generally accurate within a few percent; it is much closer than the estimate of step 503.

Step 552 first determines whether the net under consideration has a terminator. If so, step 553 adjusts the capacitance of the terminator circuit to produce a predetermined minimum net capacitance, as defined for each tree level by step 501. This minimum guarantees that one of the multiple performance levels of a driver circuit can be selected to produce the desired level delay specified in step 501.

Step 554 next selects a particular one of the available performance levels or versions of the drivers for the current net. The performance level is selected so as to achieve the desired delay at that clock level, as defined in step 501. This is done by varying the sizes of the FET devices in the driver, as explained above. The use of ten different performance levels, as shown in FIG. 4, assures tight tolerances in the resulting delays across all nets of the same level for all trees on all chips of the system. Again, the driver version is chosen for a net by reading horizontally across the graph from the desired delay to the value of the capacitive load found by step 551 for that particular branch, then choosing the driver version corresponding to that curve 410 which passes nearest the intersection of the desired delay and the calculated capacitance.

For the upper levels (210 and 220 in this embodiment), terminators are inserted into every net. Step 560 iterates through these levels in every tree of the current chip. Step 561 adjusts the value of the terminator—i.e., the size of its FET devices 342 and 343 in FIG. 3—to achieve a total capacitance in the current net which brings the delay as closely as possible to the standard delay time defined in step 501 for that tree level. With twenty different capacitance levels for the terminators, very close tolerances can be achieved. The drivers at these levels all have the same fixed performance; the entire delay adjustment is accomplished by setting the terminator values.

Steps 553 and 561 may decide that a net having a terminator does not in fact require a terminator, perhaps because the wiring-capacitance allowance given in step 503 was too great. These steps have the capability of removing the terminator in such cases, leaving only the small capacitance of the net wiring to its cell. Removal wastes a chip cell, but this happens very infrequently. It is also possible that a net capacitance is too great, even without any terminator, to bring the delay down to the desired value for that tree level; it is also possible that the branch capacitance cannot be brought up to the minimum value needed to increase the delay to the desired value, even with the largest available terminator circuit. For these rare but possible circumstances, steps 555 and 562 record a warning, giving the net location and the type of error.

Clean-up blocks 570–572 perform ancillary functions. Step 570 iterates usually under the control of a circuit designer. Step 571 allows the designer to intervene manually in the chip design. This is a conventional function, and may occur, for example, if steps 555 or 562 have indicated that the automatic portions of the method have failed to produce a design within the defined parameter values. For example, if a net has less than the minimum capacitance necessary to meet the delay specification, a designer can rewire the branch manually along a more scenic route, increasing its capacitance and hence its delay. Block 552 updates the net list or circuit configuration, if it has been changed by changed connections in step 541 or by manual intervention in step 571.

The execution sequence of the steps in method 500 is not critical, except as discussed above. For example, the design of all chips in the system could proceed in parallel, once the parameters of step 501 have been established. The different levels of all trees on a chip could be designed together, or all levels of each tree could be designed before moving on to the next tree.

Obviously, the total number of clock-tree levels is arbitrary. The preferred procedure is to design the upper tree levels with fixed-level drivers and mandatory terminators in every net, and to use multiple-level drivers and conditional terminators at the deeper tree levels. The number of upper levels—those using fixed-level drivers and terminators in every net—can be varied as desired. For chips which use only a small fraction of the available area, design time might be decreased by using fixed-level drivers and terminators at all tree levels; the wasted cells might be of little consequence. Conversely, a designer might prefer in some cases to implement all levels of the clock trees with multiple-level drivers and save the chip space otherwise required for the terminators at the upper levels; this might possibly occur, for example, in very crowded chips where a very low fanout is necessary. The design method has also stressed the equality of delay through every level of every tree; in some cases, it might be desirable to introduce some intentional clock skew. For example, some chips might require one clock at a small but non-zero offset from another, in order to prevent a race condition; the present invention can accommodate this and similar requirements easily.

Having described a preferred embodiment, we claim as our invention:

1. An integrated-circuit chip adapted to receive a plurality of logic input signals and a plurality of clock signals, comprising:
   a) a plurality of mutually interconnected functional logic circuits responsive to said logic input signals;
   b) a plurality of clock trees, each of said trees having the same number of levels, an initial one of said levels being coupled to one of said clock signals, a final one of said levels being coupled to said functional logic circuits, each of said trees including, in each of said levels, a number of stages each having a driver and a wiring network interconnecting said driver to a further one of said levels, wherein at least one of said levels comprises a plurality of stages each having a driver having an individual performance value, the performance of said driver being selected such that the delay of all said stages within the same level of all said trees is the same.

2. The integrated-circuit chip of claim 1, wherein each of said stages within said level comprising a plurality of stages each having a driver having an individual performance value has a net capacitance, said stages having less than a predetermined minimum net capacitance further including a conditional terminator having a capacitance sufficient to increase the total net capacitance to at least said minimum value.

3. The integrated-circuit chip of claim 1, wherein each said driver comprises one or more transistors having individual sizes, whereby said individual performance values of said drivers are obtained by varying the sizes of said transistors.

4. An integrated-circuit chip adapted to receive a plurality of logic input signals and a plurality of clock signals, comprising:
   a) a plurality of mutually interconnected functional logic circuits responsive to said logic input signals; and
   b) a plurality of clock trees, each of said trees having the same number of levels, an initial one of said levels being coupled to one of said clock signals and a final one of said levels being coupled to said functional logic circuits, each of said trees including, in each of said levels, a number of stages each having a driver and a wiring network interconnecting said driver to a further one of said levels, wherein at least one of said levels comprises a plurality of stages each having a terminator having an individual capacitance value, each said terminator comprising at least one active circuit element, such that the delay of all said stages within the same level of all said trees is the same.

5. The integrated-circuit chip of claim 4, wherein each of said stages within said level comprising a plurality of stages having terminators has a driver having fixed performance within said level.

6. The integrated-circuit chip of claim 4, wherein each of said levels comprises a plurality of stages each having a terminator having an individual capacitance value such that the delay in all of said stages within the same level of all said trees is the same.

7. A method for reducing clock skew in a digital system having a plurality of integrated-circuit chips each containing a set of functional logic circuits and each receiving the same plurality of clock signals, comprising the steps of:
   a) defining a plurality of clock trees for said chips and said clock signals, each of said trees having the same number of levels, and defining separate fixed level delays for each level, said level delays at each of said levels being the same for all of said trees on all of said chips;
   b) creating clock logic for all of said trees and nets for interconnecting said logic, such that the same plurality of said levels of all said trees contain driver circuits having the same, fixed performance for each of said levels and also contain terminator circuits having multiple capacitances, each of said terminator circuits comprising at least one active circuit element;
   c) placing and wiring said functional logic and said clock logic together on said chips;
   d) for each net in each of said plurality of levels of all said trees;
      1) adjusting the capacitance of the terminator in said net so as to achieve the appropriate one of said level delays.

8. The method for reducing clock skew of claim 7, wherein each said terminator circuit comprises a transistor, and wherein said step (d)(1) comprises adjusting the size of said transistor in said terminator.

9. The method for reducing clock skew of claim 7, wherein step (d)(1) comprises selecting one of a predetermined number of versions of said terminator, each of said versions having a different capacitance value.

10. The method for reducing clock skew of claim 9, wherein said chip has a plurality of cells for placing functional logic and clock logic, and wherein all of said terminator versions fit within one of said cells.

11. The method for reducing clock skew of claim 9, wherein each said predetermined version of said terminator comprises one or more transistors having individual sizes, whereby said different capacitance values are obtained by varying the sizes of said transistors.

12. An integrated-circuit chip adapted to receive a plurality of logic input signals and a plurality of clock signals, comprising:
   a) a plurality of mutually interconnected functional logic circuits responsive to said logic input signals;
   b) a plurality of clock trees, each of said trees having the same number of levels, certain of said levels being upper levels, an initial one of said upper levels being coupled to one of said clock signals, certain of said levels being deep levels, a final one of said deep levels being coupled to said functional logic circuits, each of said trees including;
      1) in each of said upper levels, a number of stages each having a driver having a fixed performance within each of said upper levels, a wiring network interconnecting said driver to a further one of said levels, and a terminator having an individual capacitance value, each said terminator comprising at least one active circuit element, such that the delay of all said stages within the same level of all said trees is the same;

2) in each of said deep levels, a number of stages each including a driver having a variable performance and including a wiring network having a net capacitance, said stages having less than a predetermined minimum net capacitance further including a conditional terminator having a capacitance sufficient to increase the total net capacitance to at least said minimum value, the performance of said driver being selected such that the delay of all said stages within the same level of all said trees is the same.

* * * * *